United States Patent [19]
Reisker et al.

[11] Patent Number: 6,051,974
[45] Date of Patent: Apr. 18, 2000

[54] MRI ENDOCAVITARY COILS AND DECONTAMINATION

[75] Inventors: Theodore J. Reisker, Willoughby Hills; David A. Molyneaux, Mentor; John T. Carlon, Madison; Benjamin R. Stern, Willoughby Hills; William O. Braum, Solon, all of Ohio

[73] Assignee: Picker International, Inc., Highland Heights, Ohio

[21] Appl. No.: 08/979,053

[22] Filed: Nov. 26, 1997

[51] Int. Cl.[7] ........................................................ G01V 3/00
[52] U.S. Cl. .......................... 324/318; 324/322; 600/410
[58] Field of Search .................................. 324/318, 322, 324/309; 606/192; 600/423, 410; 128/653

[56] References Cited

U.S. PATENT DOCUMENTS

| | | | |
|---|---|---|---|
| 5,050,607 | 9/1991 | Bradley et al. | 128/653 |
| 5,348,010 | 9/1994 | Schnall et al. | 128/653.2 |
| 5,355,087 | 10/1994 | Claiborne et al. | 324/322 |
| 5,451,232 | 9/1995 | Rhinehart et al. | 606/192 |
| 5,476,095 | 12/1995 | Schnall et al. | 128/653.2 |

OTHER PUBLICATIONS

N.M. deSouza, R. Puni, D.J. Gilderdale, and G.M. Bydder, "Magnetic Resonance Imaging of the Anal Sphincter Using an Internal Coil," Magnetic Resonance Quarterly, vol. 11, No. 1, 1995, pp. 45–55.

D. J. Gelderdale, N.M. deSouza, G.A. Coutts, and IR. Young, "A Dedicated Rectal Coil for Imaging the Female Urethra," Proceedings of the ISMRM, vol. 3, 1996, pp. 1437.

N.M. deSouza, R. Puni, D.J. Gilderdale, W.A. Kmiot, and I.R. Young High–Resolution MR Imaging of the Female Anal Sphincter Using a Dedicated Endoanal Coil: Normal Features and Appearances Following Obstetric Trauma.

*Primary Examiner*—Christine K. Oda
*Assistant Examiner*—Brij B. Shrivastav
*Attorney, Agent, or Firm*—Fay, Sharpe, Fagan, Minnich & McKee, LLP

[57] ABSTRACT

An endocavity RF coil assembly for an MRI apparatus includes a reusable probe (30). The reusable probe has a hollow outer cover (60) having a closed distal end and (62) an open proximate end (64). The distal end (62) is formed to fit into a cavity of a subject being examined. An active RF coil element (72) is rigidly formed about an internal sleeve (70) which is located within the distal end (62) of the outer cover (60). A tuning and matching circuit is disposed within the outer cover (60) on the proximate end (64) side of the active RF coil element (72). The tuning and matching circuit is arranged on a printed circuit board (74) and attached to the active RF coil element (72). An over-molded form (90) is connected to the proximate end (64) of the outer cover (60). The over-molded form (90) is arranged such that it seals the proximate end (64) of the outer cover (60) closed.

17 Claims, 8 Drawing Sheets

MRI ENDOCAVITARY COILS AND DECONTAMINATION

BACKGROUND OF THE INVENTION

The present invention relates to the magnetic resonance imaging arts. It finds particular application in conjunction with medical magnetic resonance imaging systems and will be described with particular reference thereto. It is to be appreciated, however, that the present invention may also find application in conjunction with other types of magnetic resonance imaging systems, magnetic resonance spectroscopy systems, and the like.

In magnetic resonance imaging, a substantially uniform main magnetic field is generated within an examination region. The main magnetic field polarizes the nuclear spin system of a subject being imaged within the examination region. Magnetic resonance is excited in dipoles which align with the main magnetic field by transmitting radio frequency excitation signals into the examination region. Specifically, radio frequency pulses transmitted via a radio frequency coil assembly tip the dipoles out of alignment with the main magnetic field and cause a macroscopic magnetic moment vector to precess around an axis parallel to the main magnetic field. The precessing magnetic moment, in turn, generates a corresponding radio frequency magnetic signal as it relaxes and returns to its former state of alignment with the main magnetic field. The radio frequency magnetic resonance signal is received by the radio frequency coil assembly, and from the received signals, an image representation is reconstructed for display on a human viewable display.

In certain medical MRI applications, it is advantageous to perform imaging scans over a limited field of view and depth of penetration of specific regions of the patient being examined. Such regions may include the anus, the prostrate, the cervix, and other regions associated with internal cavities of a patient. RF receive coils of the intracavitary or endocavitary type are generally used to image these regions as the proximity of the coils in such applications provides improved signal-to-noise ratio over a limited field of view and depth of penetration.

Previously, intracavitary or endocavitary RF receive coils made use of an active RP coil element contained within an inflatable non-permeable balloon. An electrical cable interfaced the active RF coil to external electrical circuitry that was used to interface the coil with the magnetic resonance imaging system. The device would be inserted into a cavity associated with the region of interest, for example a patients rectum, and the balloon would then be inflated. Finally, the external electrical interface would be used to tune and match the coil to the MRI system. Typically, such endocavitary coils were disposable and would not be reused for multiple scans. Additionally, the active RF coil element was not rigidly formed, and as such, each individual probe had to be tuned and matched. Another previous form of an endocavitary probe was reusable for a limited number of times before disposal. This form employed additional latex sheathing which could be disposed of between patient uses. However, the device was reused for only a limited number of times.

The previous endocavity RF coil probes employed external tuning and matching circuitry as part of the interface with the MRI system. The electronic tuning procedures were performed for each individual patient the coil was use on. As the active RF coil element was not fixed in location within the probe and could not be repeatedly fixed in position relative to the anatomy being imaged, image performance was not repeatable.

The present invention contemplates a new and improved endocavity RP coil assembly for an MRI apparatus which overcomes the above referenced disadvantages and others.

SUMMARY OF THE INVENTION

In accordance with one aspect of the present invention, an endocavity RF coil assembly for an MRI apparatus is provided. The endocavity RF coil assembly includes a reusable probe. The reusable probe includes a hollow outer cover having a closed distal end and an open proximate end. The distal end is formed to fit into a cavity of a subject being examined. An active RF coil element is rigidly formed about an internal sleeve which is located within the distal end of the outer cover. A tuning and matching circuit disposed within the outer cover on the proximate end side of the active RF coil element is arranged on a printed circuit board and attached to the active RF coil element. An over-molded form is connected to the proximate end of the outer cover. The over-molded form is arranged such that it seals the proximate end of the outer cover closed.

In accordance with a more limited aspect of the present invention, the endocavity RF coil assembly includes a non-magnetic RF cable connected to the tuning and matching circuit. The non-magnetic RF cable extends out of the open proximate end of the outer cover through the over-molded form to a preamplifier of the MRI apparatus. The RF cable has an outer cable insulation and a non-toxic outer jacket molded over the outer cable insulation.

In accordance with a more limited aspect of the present invention, the over-molded form and the outer jacket of the RF cable are both made out of a PVC plastic which forms a seal therebetween.

In accordance with a more limited aspect of the present invention, the internal sleeve and the outer cover are made form a medical grade ABS plastic.

In accordance with a more limited aspect of the present invention, the endocavity RF coil assembly includes a plurality of grooves cut into the outer surface of the outer cover at a proximate end. The grooves are arranged to completely encircle the outer cover such that a portion of the over-molded form is embedded therein sealing the connection between the over-molded form and the outer cover.

In accordance with a more limited aspect of the present invention, some of the plurality of grooves are arranged with flat surfaces such that the over-molded form embedded therein prevents the over-molded form from rotating with respect to the outer cover.

In accordance with a more limited aspect of the present invention, the over-molded form is a polyhedron having a plurality of sides. The plurality of sides are each indexed with a representative indicia that indicates the orientation of the active RF element within the subject being examined.

In accordance with a more limited aspect of the present invention, the over-molded form is in the shape of a sphere.

In accordance with a more limited aspect of the present invention, the endocavity RF coil assembly includes a decontamination vessel for disinfecting the outer cover of the probe. The decontamination vessel has an upper lip and a reservoir which holds decontamination fluid at a prescribed level. The upper lip is arranged such that it cradles the over-molded form at a prescribed height such that the outer cover of the probe is fully immersed in the decontamination fluid while the over-molded form does not contact the decontamination fluid.

In accordance with a more limited aspect of the present invention, the decontamination vessel has an overflow spillway which prevents the decontamination fluid from rising above the prescribed level.

In accordance with a more limited aspect of the present invention, the endocavity RF coil assembly includes an adjustable clamp having jaws adapted to selectively engage the over-molded form such that the probe is held in a fixed relationship within a cavity of the subject being examined.

In accordance with a more limited aspect of the present invention, the over-molded form includes at least one electrical component connected to the tuning and matching circuit. When the over-molded form is engaged with the adjustable clamp, the electrical component in the over-molded form is electronically coupled to at least one electrical component in the jaws of the adjustable clamp. The electrical component in the jaws of the adjustable clamp is connected to a preamplifier of the MRI apparatus.

In accordance with a more limited aspect of the present invention, the probe includes material which emits a limited magnetic resonance signal which is used to track the position of the probe relative to the subject being examined.

In accordance with a more limited aspect of the present invention, the printed circuit board is positioned and electronic components are located thereon such that image anomalies caused thereby are eliminated.

In accordance with another aspect of the present invention, an endocavity RF coil assembly for an MRI apparatus is provided. The endocavity RF coil assembly includes a reusable probe. The reusable probe has a hollow outer cover having a closed distal end for insertion into a cavity of a subject being examined and an open proximate end. The distal end has a hollow annular portion which forms a ring. An active RF coil element laid out on a flexible printed circuit board is rigidly secured within the hollow annular portion of the distal end of the outer cover. A tuning and matching circuit disposed within the outer cover on the proximate end side of the active RP coil element is arranged on a printed circuit board and attached to the active RF coil element. An over-molded form is connected to the proximate end of the outer cover. The over-molded form is arranged such that it seals the proximate end of the outer cover closed.

In accordance with a more limited aspect of the present invention, the endocavity RF coil assembly includes a latex cover which covers the distal end of the outer cover including the hollow annular portion. The latex cover is arranged such that the latex cover is selectively collapsible to selectively allow anatomy of the subject being examined to reside inside the ring formed by the annular portion of the outer cover.

In accordance with another aspect of the present invention, a radio frequency coil assembly is provided in a magnetic resonance imaging apparatus. The magnetic resonance imaging apparatus includes a main magnet which generates a substantially uniform main magnetic field within an examination region, a gradient coil assembly for generating substantially linear magnetic gradients across the examination region, a current supply for selectively supplying electrical pulses to the gradient coil assembly, a radio frequency coil assembly positioned to transmit radio frequency signals into the subject receiving region and receive radio frequency signals therefrom, a transmitter for supplying radio frequency signals to the radio frequency coil assembly, a receiver for receiving radio frequency signals via the radio frequency coil assembly, and a reconstruction processor for reconstructing an image representation from the signal received by the radio frequency receiver to display on a human viewable display. The radio frequency coil assembly includes a reusable endocavity probe for imaging a specific region of interest of a subject within the examination region. The probe includes a hollow outer cover having a closed distal end an open proximate end. The distal end is formed to fit into a cavity of the subject. An active RF coil element is rigidly formed about an internal sleeve which is located within the distal end of the outer cover. A tuning and matching circuit is disposed within the outer cover on the proximate end side of the active RF coil element. The tuning and matching circuit is arranged on a printed circuit board and attached to the active RP coil element. An over-molded form is connected to the proximate end of the outer cover. The over-molded form is arranged such that the over-molded form seals the proximate end of the outer cover closed.

One advantage of the present invention is that the probe is reusable.

Another advantage of the present invention is that it can be manufactured to meet the electrical and mechanical compliance standards required.

Another advantage of the present invention is that the active RF coil element location may be fixed with respect to the anatomy being imaged.

Another advantage of the present invention is that external circuitry for performing tuning and matching adjustments on a per-patient basis is eliminated.

Another advantage of the present invention is the reduction of motion artifacts by clamping the probe in a fixed position while performing the scan.

Another advantage of the present invention is the prevention of the ingress of fluids into the interior of the reusable probe.

Another advantage of the present invention is the protection of subjects from RF burn.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
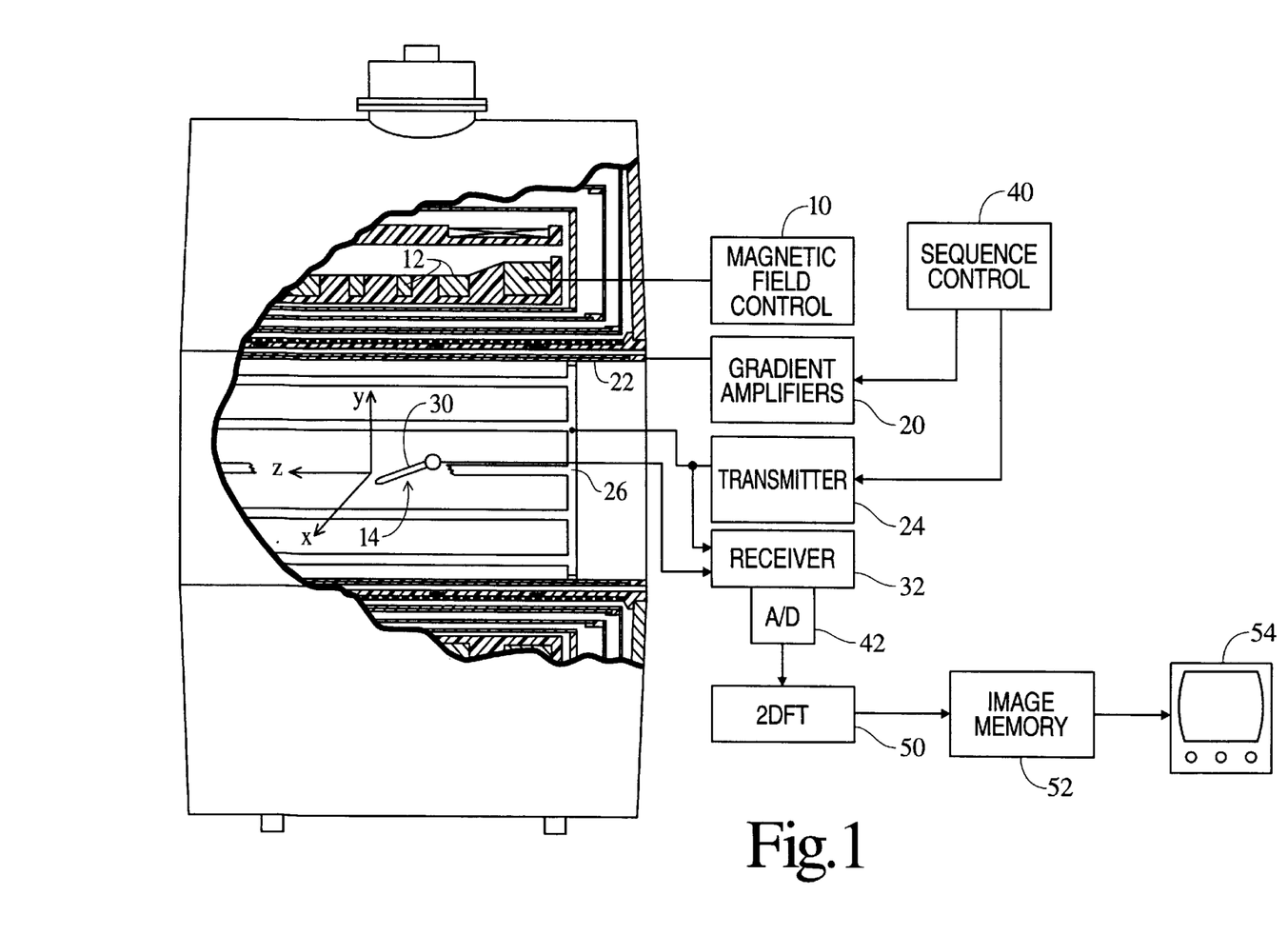
FIG. 1 is a diagrammatic illustration of a MRI apparatus in accordance with the present invention.

With reference to FIG. 1, a main magnetic field control 10 controls superconducting or resistive magnets 12 such that a substantially uniform, temporally constant main magnetic field is created along a z axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spin, and the like to generate magnetic resonance imaging and spectroscopy sequences. More specifically, gradient pulse amplifiers 20 apply current pulses to selected ones or pairs of whole-body gradient coils 22 to create magnetic field gradients along x, y and z-axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up by the whole-body RF coil 26.

For generating images of limited regions of the subject, local coils are commonly placed contiguous to the selected region. For example, a receive-only local radio frequency coil can be used to receive resonance signals introduced by body-coil RF transmissions, such as an endocavitary RF coil assembly probe 30. The resultant radio frequency signals are picked up by the whole-body RF coil 26 or other specialized RF coils and demodulated by a receiver 32 preferably including a preamplifier (not illustrated).

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 32 receives a plurality of data lines in rapid succession following each RF excitation pulse. An analog-to-digital converter 42 converts each data line to a digital format. The analog-to-digital converter is disposed between the radio frequency receiving coil and the receiver for digital receivers and is disposed downstream from the receiver for analog receivers. Ultimately, the radio frequency signals received are demodulated and reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a man-readable display of the resultant image.

Figure 2A:
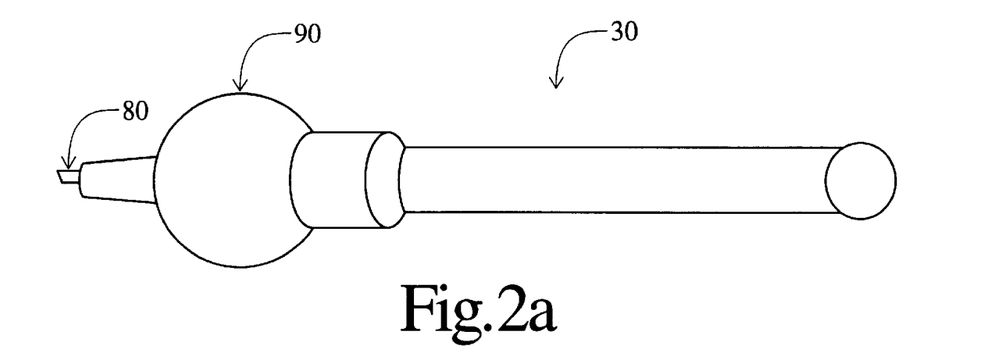
FIG. 2 is an illustration of an anal probe in accordance with the endocavity RF coil assembly of the present invention.
Figure 2B:
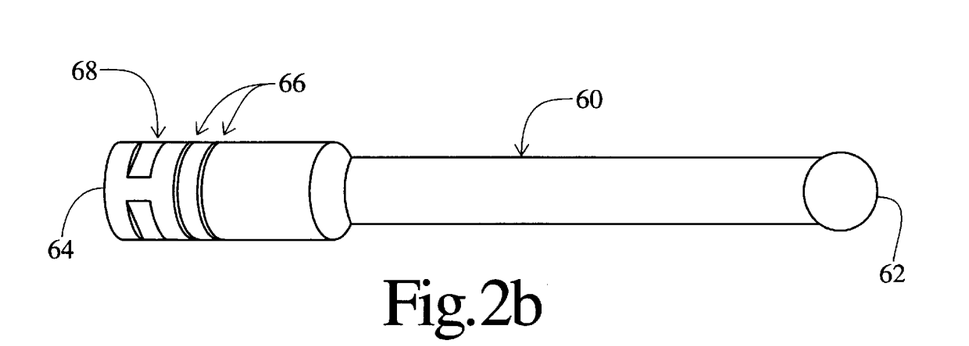
FIG. 2b is an illustration of an outer cover of the anal probe in accordance with the present invention.
Figure 2C:
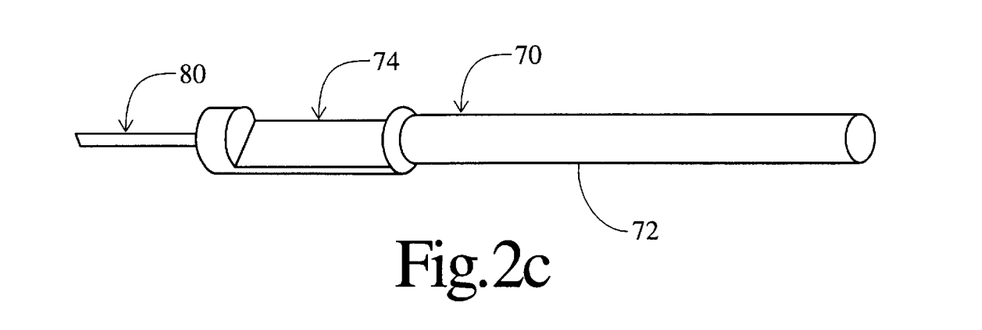
FIG. 2c is an illustration of an internal sleeve of the anal probe in accordance with the present invention.

With reference to FIGS. 2a–c, an endocavity RF coil assembly is used to pick up radio frequency signals generated by relaxing magnetic dipoles. The endocavity RF coil assembly includes a reusable probe 30 which is inserted into a cavity of a subject being examined so as to be contiguous to a region of interest, such as the anus, the prostate, the cervix, or the like. The coil's proximity to the region of interest provides for a relatively high signal-to-noise ratio. In one preferred embodiment, the reusable probe 30 is constructed from a hollow outer cover 60 having a closed distal end 62 and an open proximate end 64, the closed distal end 62 formed to fit into the cavity of the subject being examined. At the proximate end 64 of the outer cover 60, on an outside surface thereof, a number of grooves 66 are cut. The grooves 66 extend completely around the outside surface of the outer cover 60. Further, flat grooved quadrants 68 are also cut out of the proximate end 64 on the outside surface of the outer cover 60. Preferably, the outer cover 60 is constructed of medical grade ABS plastic. The ABS material is appropriately flame retardant and is specifically intended for limited exposure to mucus membrane or blood barrier contact. An internal sleeve 70, preferably also made out of medical grade ABS material, is formed to be seated within the hollow outer cover 60. An active RF coil element 72 is positioned within machine grooves along the internal sleeve 70 at the end located within the distal end 62 of the outer cover 60. The end of the internal sleeve which is located within the proximate end 64 of the outer cover 60 holds a tuning and matching circuit which is arranged on a printed circuit board 74. The printed circuit board 74 is attached to the active RF coil element 72. The electronic components mounted on the printed circuit board 74 that make up the tuning and matching circuit are preferably non-magnetic or minimally magnetic. The printed circuit board layout for electronic component placement and the distance of the printed circuit board 74 from the active coil element 72 are specifically designed to reduce or eliminate image anomalies caused by the magnetic content of the electronic components used.

A specially constructed RF cable 80 connects the output of the tuning and matching circuit to the MRI system preamplifier. Preferably, the cable 80 has been constructed from a non-magnetic version of a standard RG174 cable. Over the outer cable insulation, a non-toxic PVC outer jacket has been molded. The PVC jacket provides an appropriate non-toxic contact with a patient and also provides an electrical field insulating distance between the patient and the outer electrical shield of the cable thereby preventing the risk of RF burn.

An over-molded form 90 seals the open proximate end of the hollow outer cover. Preferably, the over-molded form 90 is constructed of PVC plastic. The over-molded form 90 is formed over the outer surface of the proximate end and 64 covers the grooves 66 and flat grooved quadrants 68. The RF cable 80 extends from the tuning and matching circuit out of the open proximate end 64 through the over-molded form 90. As a portion of the over-molded form 90 is embedded in the circumferential grooves 66 formed on the outer surface of the hollow outer cover 60, a tight mechanical seal is provided therebetween which is appropriately resistant to the ingress of fluid. The interface between the over-molded form 90 and RF cable 80 is appropriately resistant to the ingress of fluid due to a chemical PVC-to-PVC seal provided therebetween. Further, being that the over-molded form 90 is formed around the flat grooved quadrants 68, the over-molded form 90 will not rotate with respect to the outer cover 60.

Figure 3:
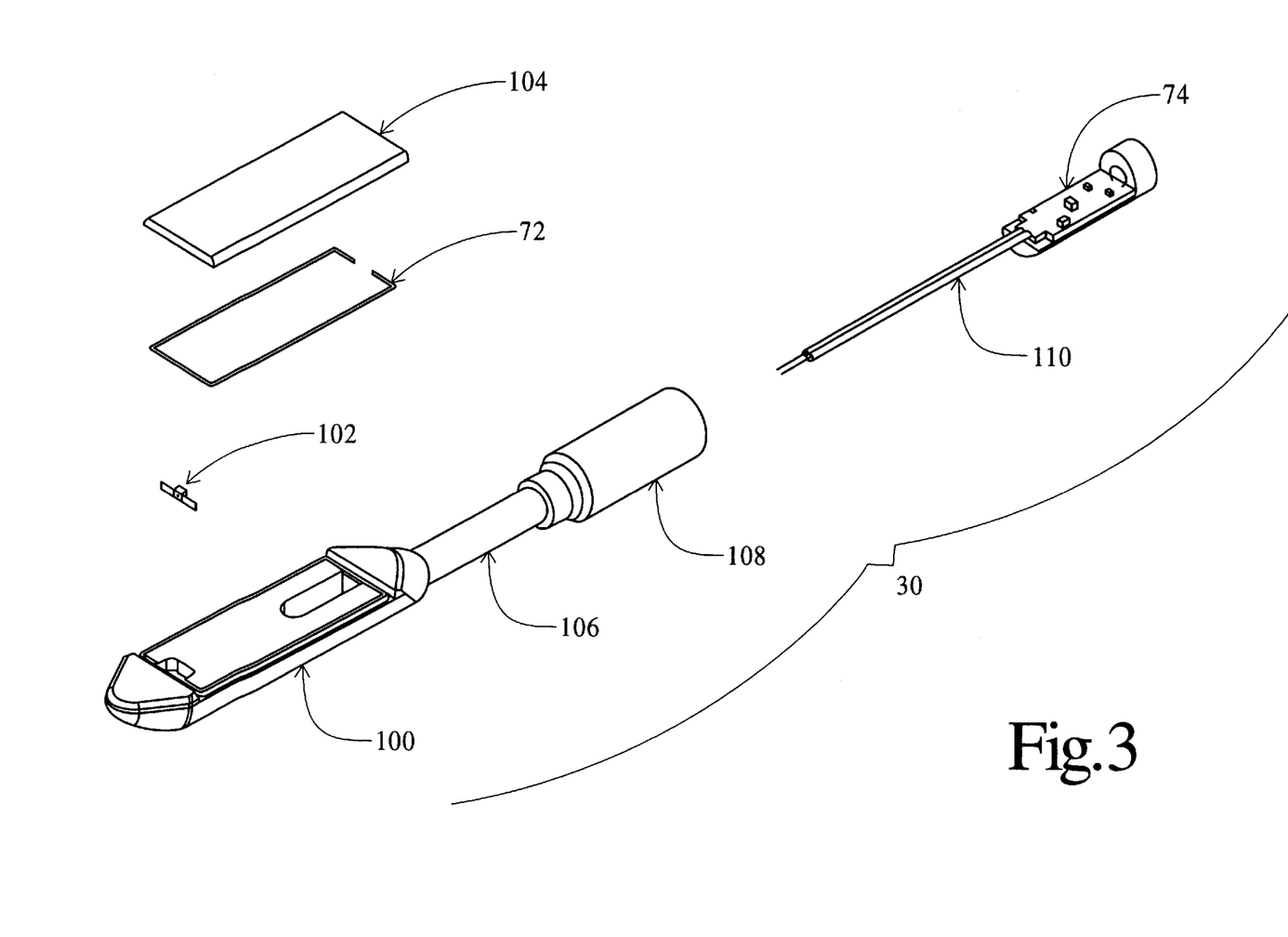
FIG. 3 is an exploded view of a prostate probe in accordance with the endocavity RF coil assembly of the present invention.

With reference to FIG. 3, in another preferred embodiment, the endocavity RF coil assembly includes a probe 30 for examination of the prostrate. The prostrate probe includes an internal shell 100, preferably constructed of medical grade ABS plastic, which has a form for locating and mounting a small printed circuit board (not illustrated) for mounting a resonating capacitor 102 and for locating and mounting the active RF coil element 72. A cover 104, also preferably made out of medical-grade ABS plastic, seals the internal shell 100 providing a barrier between the outside and the components formed on the internal shell 100. A shaft assembly is threaded and glued to the internal shell 100. The shaft assembly 106 is hollow and connects the internal shell 100 to a printed circuit board outer cover 108. Semi rigid coaxial cables 110 extend through the hollow shaft assembly 106 and connect the active RF coil element 72 to a printed circuit board 74 which resides in the printed circuit board outer cover 108. The printed circuit board 74 holds the tuning and matching circuitry. While not shown, the printed circuit board outer cover 108 includes grooves and flat grooved quadrants, over-molded form, and specially constructed RF cable in the same manner as the previously discussed preferred embodiment.

Figure 4:
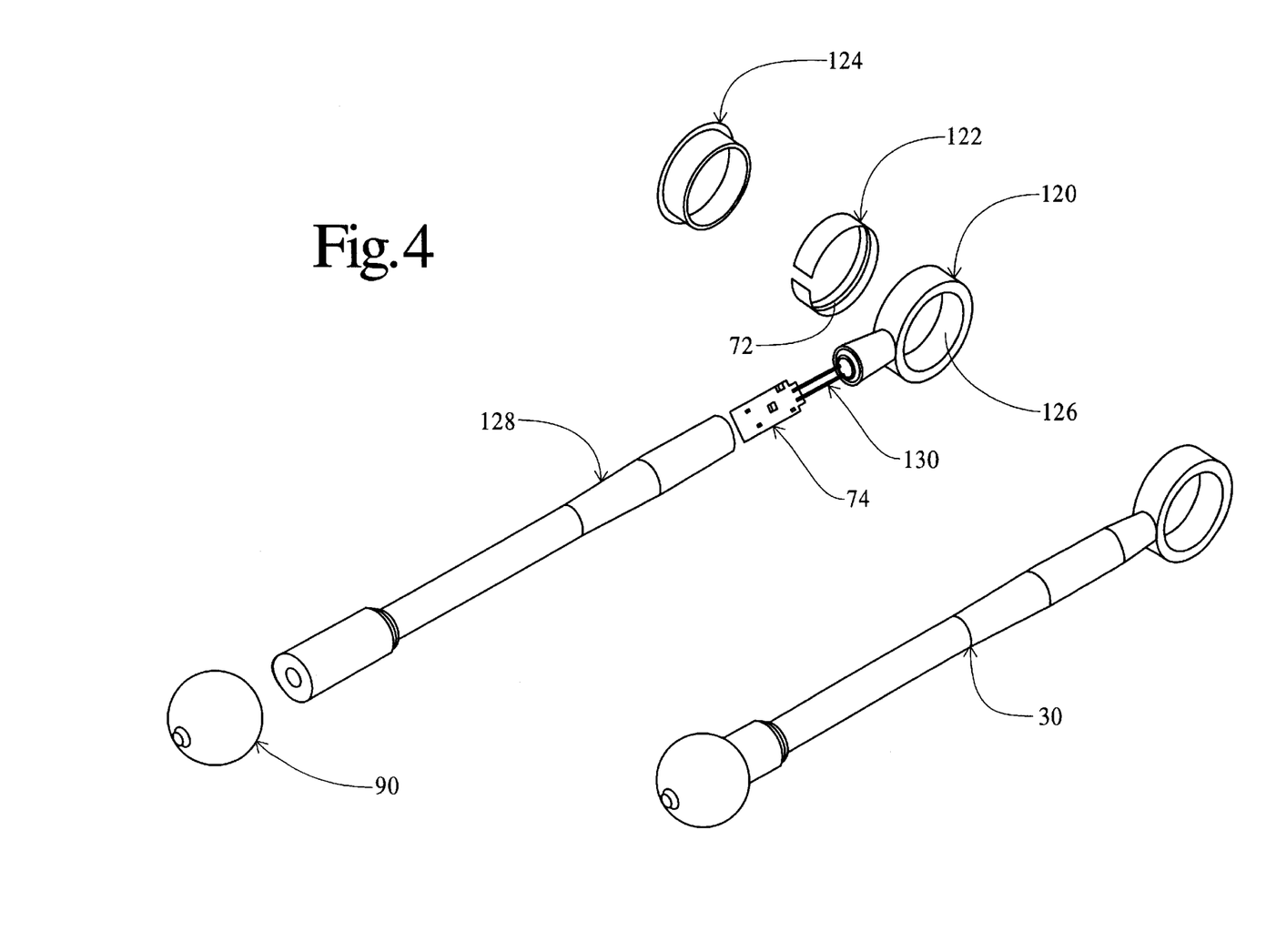
FIG. 4 is an exploded view of a cervix probe in accordance with the endocavity RF coil assembly of the present invention.
Figure 5:
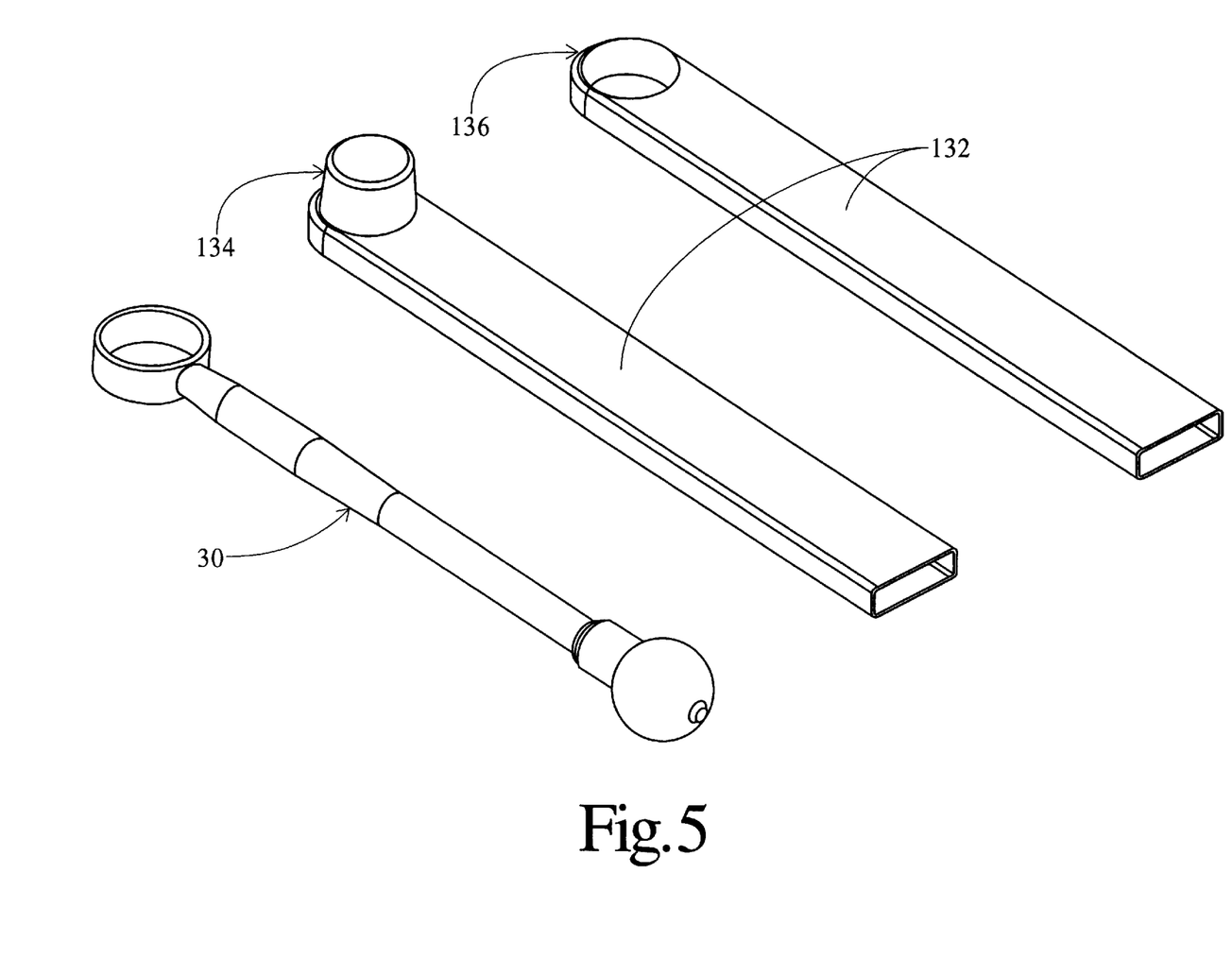
FIG. 5 is an illustration of a latex cover for use with the cervix probe in accordance with the present invention.

With reference to FIG. 4, in another preferred embodiment, the endocavity RF coil assembly includes a cervical probe 30. The cervical probe 30 includes a hollow annular portion 120 in which the active RF coil element 72 is rigidly secured. In this embodiment the active RF coil element 72 is laid out on a flexible printed circuit board 122. The flexible printed circuit board 122 is rigidly secured between an internal ring cover 124 and an external ring-to-shaft assembly 126. Both the internal ring cover 124 and the external ring-to-shaft assembly 126 are preferably constructed of medical grade ABS plastic. The external ring-to-shaft assembly 126 is connected to a shaft assembly 128 which houses a printed circuit board 74 containing the tuning and matching circuitry. Two 18AWG wires 130 are attached to the printed circuit board and extend therefrom to the active RF coil element through the external ring-to-shaft assembly 126. Preferably, an insulating sleeve is placed over the two wires. The internal ring cover 124, external ring-to-shaft assembly 126, and shaft assembly 128 are all appropriately glued to seal the probe 30 from the ingress of fluids. Again, while not illustrated, this embodiment also employs the specially constructed RF cable and the grooves and flat groove quadrants of the previous embodiments. With reference to FIG. 5, the cervix probe 30 also includes an outer latex cover 132. The outer latex cover 132 is selectively expanded 134 or collapsed 136 to selectively allow the cervix anatomy to reside in a pocket therein such that the anatomy would be located within the ring formed by the annular portion of the probe. The latex cover 132 may be expanded and collapsed by inflating and deflating it.

Figure 6:
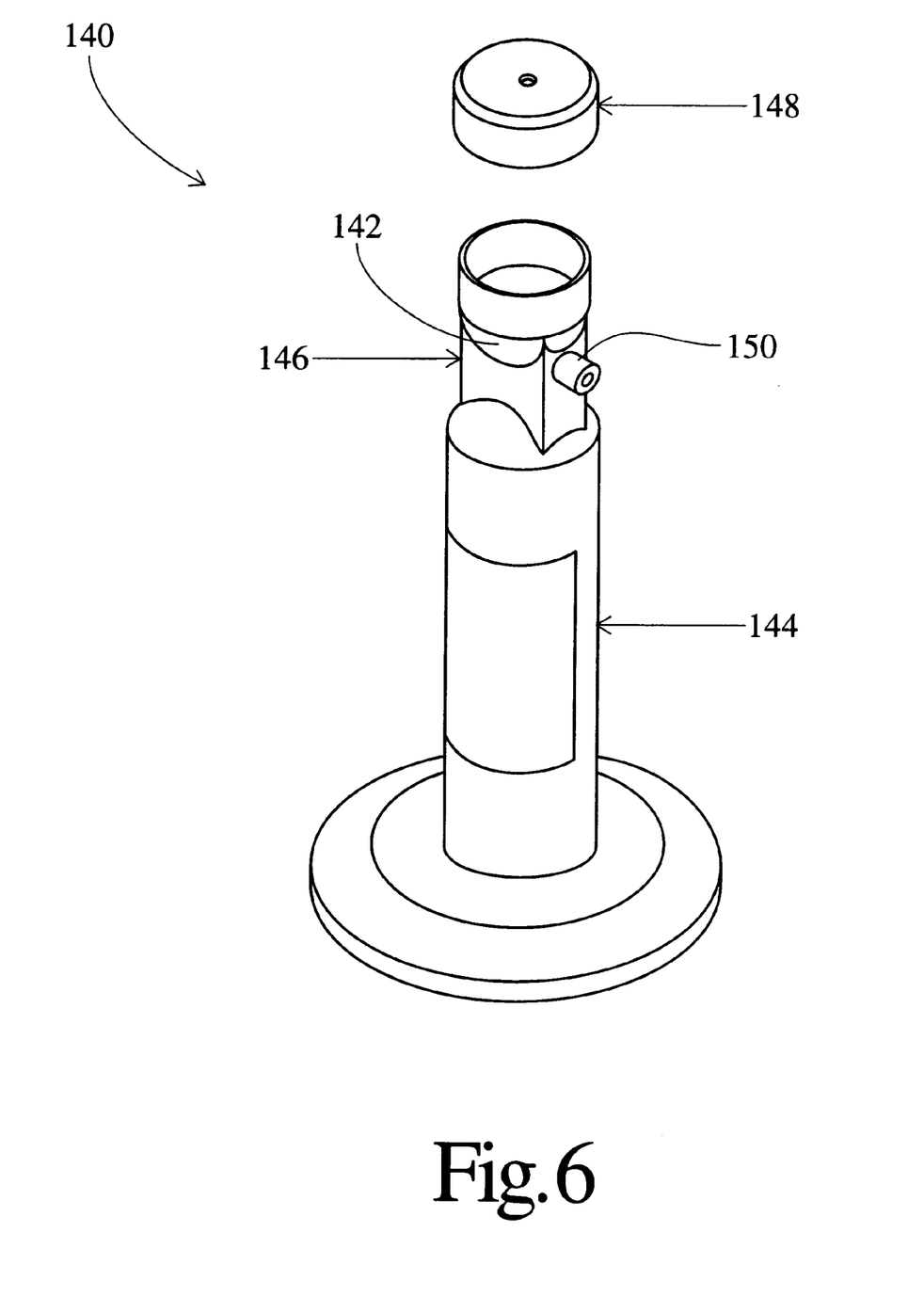
FIG. 6 is an illustration of a decontamination vessel in accordance with the endocavity RF coil assembly of the present invention.

Referring to FIG. 6, the endocavity RF coil assembly includes a decontamination vessel 140 for disinfecting the outer cover of the probes. The decontamination vessel 140 is compatible with all embodiments of the various probes. An upper lip 142 is arranged at the top of the vessel such that it cradles the over-molded form 90. The upper lip 142 can be constructed to cooperate with the over-molded form 90 by having the same shape. The upper lip 142 holds the probe at a prescribed height so that the outer cover is fully emersed in a decontamination fluid which resides in a reservoir 144 of the decontamination vessel 140. The disinfecting fluid may be gluderaldehyde, alcohol, hydrogen peroxide, or like disinfectant. The rectangular throat 146 allows the outer cover of the probes 30 to extend into the disinfecting fluid but will not allow the over-molded form 90 to pass through. A cap 148 is also provided for sealing the decontamination vessel 140 when not in use. The decontamination vessel 140 also has an overflow spillway 150 which prevents the decontamination fluid from rising above the prescribed level. That is to say, if the level of the decontamination fluid is too high when the probe 30 is inserted, as the probe 30 displaces the fluid and the level rises, it spills through the overflow spillway 150 rather than rising above the predetermined level. This prevents the decontamination fluid from contacting the over-molded form 90 or specially constructed RF cable 80, to protect the PVC plastic parts from exposure to the decontamination fluid which might be damaging thereto and further protect the seals between the over-molded form 90 and the outer cover and the seal between the over-molded form 90 and the specially constructed RF cable 80 from possible ingress of fluid.

Figure 7:
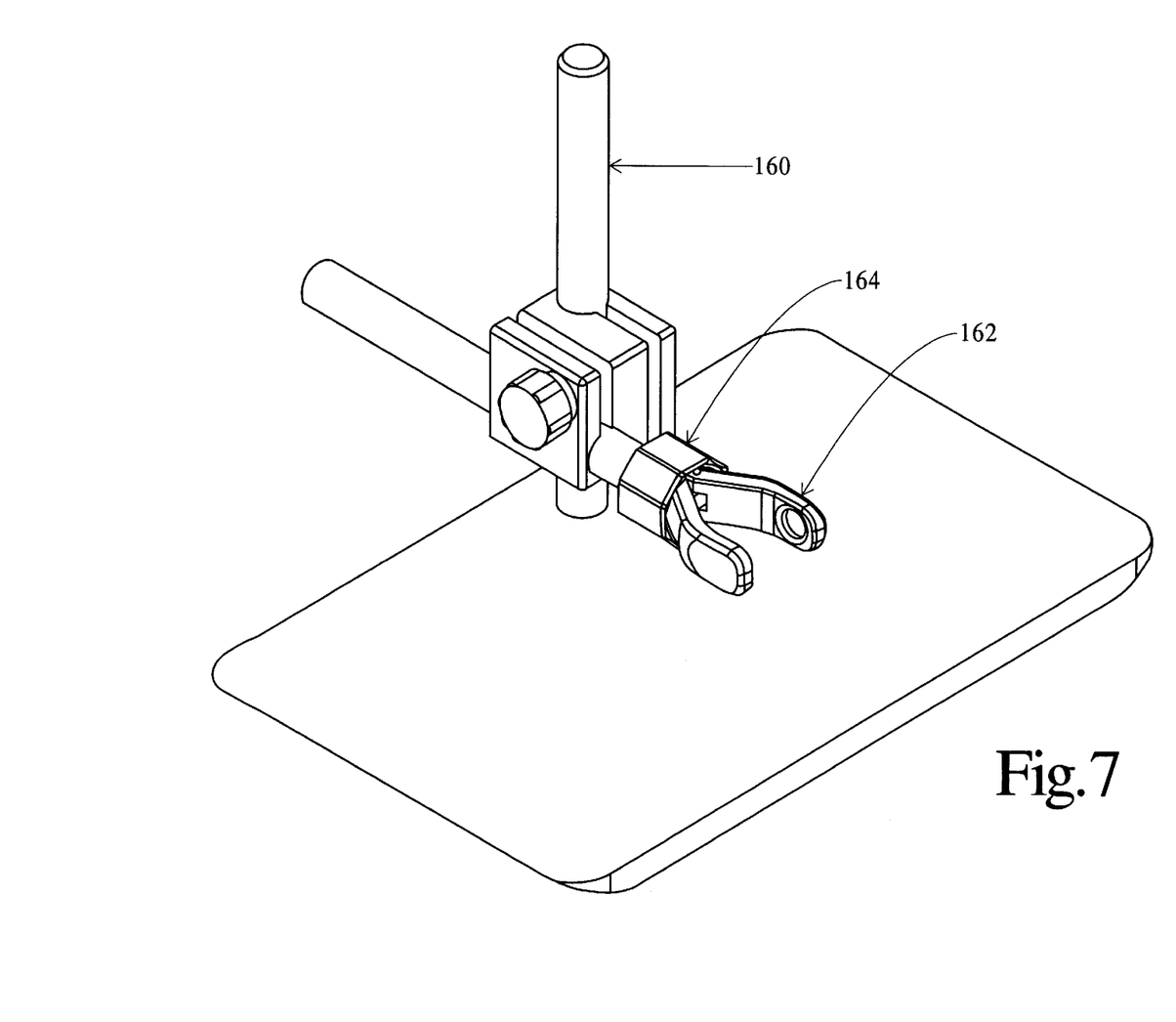
FIG. 7 is an illustration of an adjustable clamp in accordance with the endocavity RF coil assembly of the present invention.
Figure 8:
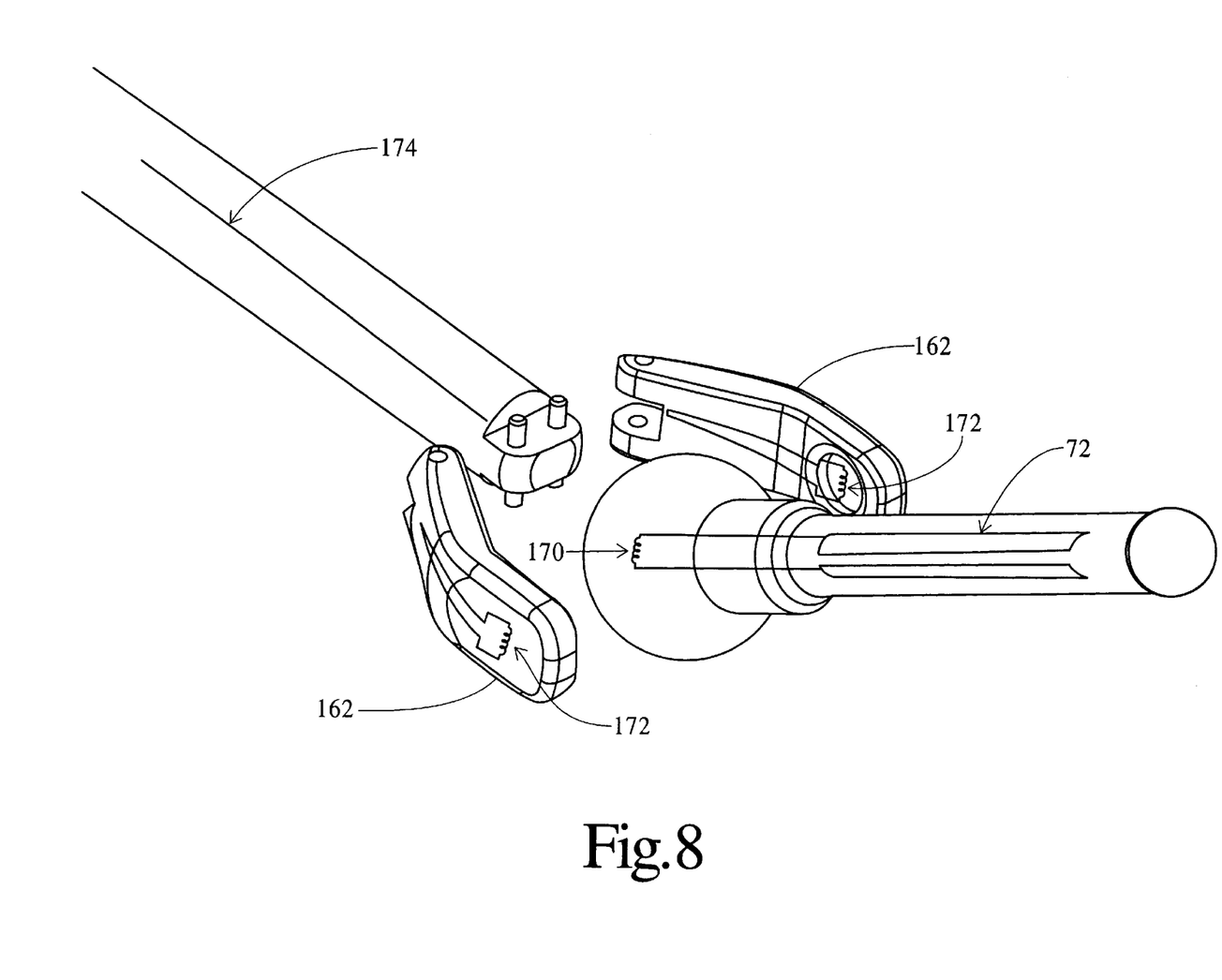
FIG. 8 is an illustration of the electronic coupling between a probe and the clamp in accordance with the present invention.

With reference to FIG. 7, an adjustable clamp 160 having jaws 162 adapted to selectively engage the over-molded form 90 is used to hold the probe 30 in a fixed relationship within the cavity of the subject being examined. The adjustable clamp jaws 162 are selectively engaged by turning a backnut 164. The jaws are formed to the shape of the over-molded form 90 to allow maximum freedom in the positioning of the probe 30. With reference to FIG. 8, in one preferred embodiment, the probe does not include a specially constructed RF cable. Rather, the over-molded form 90 completely seals the open end of the hollow outer cover. An electrical component 170, such as an inductive coil, within the over-molded form 90 is connected to the tuning and matching circuit which is in turn connected to the active RF coil element 72 of the probe 30. The electrical component 170 in the over-molded form 90 is electronically coupled to electrical components 172, such as inductive coils, housed within the jaws 162 of the adjustable clamp 160. The electrical components 172 in the jaws 162 of the adjustable clamp 160 are then in turn connected to a preamplifier of the MRI apparatus via cable 172. In this manner, the probe is connected to the preamplifier of the MRI apparatus without the use of extraneous RF cables.

While the illustrated over-molded form 90 has been depicted as being spherical in shape, the over-molded form 90 may take on other appropriate shapes. For example, in one preferred embodiment, the over-molded form 90 takes the shape of a polyhedron. Each side of the polyhedron is marked with appropriate indicia. In this manner, the over-molded form 90 can be exploited for indexing the relative orientation of the probe 30 and the active RF coil element 72 rigidly secured therein with respect to the patient. In another alternate embodiment, the probe 30 may include materials in its construction which emit a limited nuclear magnetic resonance signal. Again, this allows the relative position and orientation of the probe 30 within the subject to be determined relative to the anatomy being imaged.

One advantageous aspect of the present invention is the fact that the probe 30 is sealed to prevent the ingress of fluids. While described with reference to grooves 66 in which the over-molded form 90 was embedded to make a mechanical seal, it is appreciated that other means such as ultrasonically welding or use of medical-grade adhesive in construction may be used to create the appropriate seals. As well, seals between any other two interfaces of the probe may be ultrasonically welded or glued with medical-grade adhesive to create a barrier which prevents the ingress of fluids.

While the specifically constructed RF cable 80 has been described as connecting the tuning and matching circuit of the probe 30 to the preamplifier of the magnetic resonance imaging system, in one preferred embodiment, the preamplifier is integrated into the probe 30 and mounted on the same printed circuit board 74 as the tuning and matching circuit.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. An endocavity RF coil assembly for an MRI apparatus comprising:
    a reusable probe having;
        a hollow outer cover having a closed distal end and an open proximate end, the distal end formed to fit into a cavity of a subject being examined;
        an active RF coil element rigidly formed about an internal sleeve which is located within the distal end of the outer cover;
        a tuning and matching circuit disposed within the outer cover on the proximate end side of the active RF coil element, the tuning and matching circuit being arranged on a printed circuit board and attached to the active RF coil element; and,
        an over-molded form connected to the proximate end of the outer cover, the over-molded form being arranged such that the over-molded form seals the proximate end of the outer cover closed.

2. The endocavity RF coil assembly according to claim 1, further including:
    a non-magnetic RF cable connected to the tuning and matching circuit extending out the open proximate end of the outer cover through the over-molded form to a preamplifier of the MRI apparatus, the RF cable having an outer cable insulation and a non-toxic outer jacket molded over the outer cable insulation.

3. The endocavity RF coil assembly according to claim 2, wherein the over-molded form and the outer jacket of the RF cable are both made out of a PVC plastic which forms a seal therebetween.

4. The endocavity RF coil assembly according to claim 1, wherein the internal sleeve and the outer cover are made from a medical grade ABS plastic.

5. The endocavity RF coil assembly according to claim 1, further including:
    a plurality of grooves cut into an outer surface of the outer cover at the proximate end, the grooves being arranged to completely encircle the outer cover such that a potion of the over-molded form is embedded therein sealing the connection between the over-molded form and the outer cover.

6. The endocavity RF coil assembly according to claim 5, wherein some of the plurality of grooves are arranged with flat surfaces such that the over-molded form embedded therein prevents the over-molded form from rotating with respect to the outer cover.

7. The endocavity RF coil assembly according to claim 6, wherein the over-molded form is in the shape of a polyhedron having a plurality is sides, each side indexed with representative indicia indicating the orientation of the active RF coil element within the subject being examined.

8. The endocavity RF coil assembly according to claim 1, wherein the over-molded form is in the shape of a sphere.

9. The endocavity RF coil assembly according to claim 1, further including:
    a decontamination vessel for disinfecting the outer cover of the probe, the decontamination vessel having an upper lip and a reservoir which holds a decontamination fluid at a prescribed level, the upper lip being arranged such that it cradles the over-molded form at a prescribed height so that the outer cover is fully immersed in the decontamination fluid and the over-molded form is not in contact with the decontamination fluid.

10. The endocavity RF coil assembly according to claim 9, wherein the decontamination vessel has an overflow spillway such that the decontamination fluid is prevented from rising above the prescribed level.

11. The endocavity RF coil assembly according to claim 1, further including:
    an adjustable clamp having jaws adapted to selectively engage the over-molded form such that the probe is held in a fix relationship within a cavity of the subject being examined.

12. The endocavity RF coil assembly according to claim 1, wherein the over-molded form includes at least one electrical component connected to the tuning and matching circuit, such that when the over-molded form is engaged with the adjustable clamp the electrical component in the over-molded form is electronically coupled to at least one electrical component in the jaws of the adjustable clamp which is connected to a preamplifier of the MRI apparatus.

13. The endocavity RF coil assembly according to claim 1, wherein the probe includes material which emits a limited magnetic resonance signal which is used to track a position of the probe relative to the subject being examined.

14. The endocavity RF coil assembly according to claim 1, wherein the printed circuit board is positioned and electronic component are located thereon such that image anomalies caused thereby are eliminated.

15. An endocavity RF coil assembly for an MRI apparatus comprising:
    a reusable probe having;
        a hollow outer cover having a closed distal end for insertion into a cavity of a subject being examined and an open proximate end, the distal end having a hollow annular portion which forms a ring;
        an active RF coil element laid out on a flexible printed circuit board which is rigidly secured within the hollow annular portion of the distal end of the outer cover;
        a tuning and matching circuit disposed within the outer cover on the proximate end side of the active RF coil element, the tuning and matching circuit being arranged on a printed circuit board and attached to the active RF coil element; and,
        an over-molded form connected to the proximate end of the outer cover, the over-molded form being arranged such that the over-molded form seals the proximate end of the outer cover closed.

16. The endocavity RF coil assembly according to claim 14, further including:
    a latex cover covering the distal end of the outer cover including the hollow annular portion, arranged such that the latex cover is selectively collapsible to selectively allow anatomy of the subject being examined to reside inside the ring formed by the annular portion of the outer cover.

17. In a magnetic resonance imaging apparatus having a main magnet which generates a substantially uniform main magnetic field within an examination region, a gradient coil assembly for generating substantially linear magnetic gradients across the examination region, a current supply for selectively supplying electrical current pulses to the gradient coil assembly, a radio frequency coil assembly positioned to transmit radio frequency signals into the subject receiving region and receive radio frequency signals therefrom, a transmitter for supplying radio frequency signals to the radio frequency coil assembly, a receiver for receiving radio frequency signals via the radio frequency coil assembly, and a reconstruction processor for reconstructing an image representation from the signals received by the radio frequency receiver to display on a human viewable display, the radio frequency coil assembly comprising:

a reusable endocavity probe for imaging a specific region of interest of a subject within the examination region having;

a hollow outer cover having a closed distal end and an open proximate end, the distal end formed to fit into a cavity of the subject;

an active RF coil element rigidly formed about an internal sleeve which is located within the distal end of the outer cover;

a tuning and matching circuit disposed within the outer cover on the proximate end side of the active RF coil element, the tuning and matching circuit being arranged on a printed circuit board and attached to the active RF coil element; and,     an over-molded form connected to the proximate end of the outer cover, the over-molded form being arranged such that the over-molded form seals the proximate end of the outer cover closed.

\* \* \* \* \*